(12) United States Patent
Takahashi

(10) Patent No.: US 7,764,556 B2
(45) Date of Patent: Jul. 27, 2010

(54) SEMICONDUCTOR STORAGE DEVICE INCLUDING COUNTER NOISE GENERATOR AND METHOD OF CONTROLLING THE SAME

(75) Inventor: Hiroyuki Takahashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 131 days.

(21) Appl. No.: 12/232,190

(22) Filed: Sep. 12, 2008

(65) Prior Publication Data

US 2009/0073779 A1 Mar. 19, 2009

(30) Foreign Application Priority Data

Sep. 13, 2007 (JP) ............................. 2007-237882

(51) Int. Cl.
G11C 7/02 (2006.01)
(52) U.S. Cl. .................. 365/206; 365/149; 365/189.05; 365/189.07; 365/189.09; 365/189.17
(58) Field of Classification Search .................. 65/149, 65/189.05, 189.07, 189.09, 189.17, 206
See application file for complete search history.

(56) References Cited

U.S. PATENT DOCUMENTS

| 6,021,063 | A  | * | 2/2000 | Tai ............................. 365/149 |
| 6,236,598 | B1 | * | 5/2001 | Chou ...................... 365/189.06 |
| 6,768,687 | B2 |   | 7/2004 | Kaihatsu |

FOREIGN PATENT DOCUMENTS

JP 2002-184173 A 6/2002

\* cited by examiner

*Primary Examiner*—Hoai V Ho
(74) *Attorney, Agent, or Firm*—Foley & Lardner LLP

(57) ABSTRACT

A semiconductor storage device according to one aspect of the present invention includes a reference voltage source connected to a capacitor of a cell included in a memory, a buffer circuit holding data to be written in the cell, and a counter noise generator outputting a counter noise current canceling a noise current generated by rewriting the data in the cell to the reference voltage source according to the data held in the buffer circuit.

14 Claims, 10 Drawing Sheets

|  | NUMBER OF WRITTEN DATA IN BUFFER CIRCUIT | | 1/2 OF DIFFERENCE BETWEEN NUMBER OF DATA IN L LEVEL AND NUMBER OF DATA IN H LEVEL | COUNTER NOISE CURRENT |
|---|---|---|---|---|
|  | L LEVEL | H LEVEL | | |
|  | 0 | 8 | −4 | +4 |
| (a) → | 1 | 7 | −3 | +3 |
|  | 2 | 6 | −2 | +2 |
|  | 3 | 5 | −1 | +1 |
| (b) → | 4 | 4 | 0 | 0 |
|  | 5 | 3 | +1 | −1 |
| (c) → | 6 | 2 | +2 | −2 |
|  | 7 | 1 | +3 | −3 |
| (d) → | 8 | 0 | +4 | −4 |

Fig. 8

SEMICONDUCTOR STORAGE DEVICE INCLUDING COUNTER NOISE GENERATOR AND METHOD OF CONTROLLING THE SAME

BACKGROUND OF THE INVENTION

1. Field of the Invention

The present invention relates to a semiconductor storage device including a counter noise generator and a method of controlling the same.

2. Description of Related Art

A DRAM (Dynamic Random Access Memory) includes complementary bit lines arranged in perpendicular to word lines, and memory cells arranged in intersections of the word lines and the complementary bit lines in matrix form.

FIG. 9 shows one example of a schematic configuration diagram of a related DRAM 900. The DRAM 900 includes memory cell areas (911, 912, ..., 91m) where a plurality of memory cells are arranged, sense amplifier areas (921, 922, ..., 92m), an HVDD power source 930 (output voltage VDD/2), and a buffer circuit 940. Data written into the memory cells are transferred to the memory areas (911, 912, ..., 91m) from the buffer circuit 940 through each of the sense amplifier areas (921, 922, ..., 92m) by common data lines DBus.

FIG. 10 shows one example of a circuit configuration diagram of the memory cell area 911 and the sense amplifier area 921. As shown in FIG. 10, the memory cell area 911 includes memory cells 1011, 1012, ..., 101n connected to a bit line BT or BN. In this specification, a complementary bit line pair BT and BN of True and Bar will be referred to as BT/BN. The sense amplifier area 921 includes an equalizer 1021, a sense amplifier 1022, and a column selector 1023. The equalizer 1021 sets a voltage of the complementary bit line pair BT/BN to VDD/2, the sense amplifier 1022 amplifies a potential difference of the complementary bit line pair BT/BN, and the column selector 1023 connects the complementary bit line pair BT/BN and the common data lines DBus (True/Bar).

Each memory cell includes a gate transistor and a capacitor. For example, in the memory cell 1011, a gate transistor Tr1 includes a gate connected to a word line WL1, one of a drain and a source connected to a bit line BT1, and the other of the drain and the source connected to one terminal of a capacitor C1 through a cell node SN1. The other terminal of the capacitor C1 is connected to the HVDD power source 930. Other memory cells also have the same configurations as described above.

Now, we consider a case in which data "H" held in the memory cell 1011 is rewritten to "L" as an example. First, a word select signal of the word line WL1 is raised to turn on the gate transistor Tr1. Accordingly, the cell node SN1 and the bit line BT are connected through the gate transistor Tr1. Next, the potential difference of the complementary bit line pair BT/BN is amplified by the sense amplifier 1022. Then the column selector 1023 is turned on by a column select signal Y, and the L level (ground potential GND) for writing is transferred to the bit line BT from the buffer circuit 940 through the common data line DBus (True).

Since there is a difference in an ability of the amplifier between the buffer circuit 940 and the sense amplifier 1022, the potential of the bit line BT inverts from the H level to the L level. Therefore, the potential of the cell node SN1 is in the L level (ground potential GND), and the capacitor C1 releases charge into a bit line side. In summary, the charge flows in a counter plate of the capacitor C1 so that the current is supplied to the capacitor C1 from the HVDD power source 930. Then the word select signal of the word line WL1 is fallen to turn off the gate transistor Tr1. The cell node SN1 and the bit line BT are disconnected to complete the data writing into the memory cell 1011. At this time, the data held in the memory cell 1011 is "L". When the data "L" held in the memory cell 1011 is rewritten to "H", the potential of the above operation will be reversed.

As stated above, the voltage of the cell node of each memory cell fluctuates when the data held in the memory cell is rewritten. Then the current flows into the HVDD power source 930 which is capacity-coupled with the cell node by the capacitor or the current is supplied from the HVDD power source 930. Thus a noise current against the HVDD power source 930 is produced.

On the other hand, in recent years, a semiconductor device in which a logic part such as a controller and a DRAM part (hereinafter referred to as eDRAM: embedded DRAM) are mounted in one chip has become popular such as a system LSI (Large Scale Integration). Since the eDRAM and the logic part are mixedly mounted on the chip as stated above, there is little limitation on the interface between the controller and the eDRAM, and power saving operation can be realized. Therefore, there is a tendency of increasing the number of I/Os between the controller and the eDRAM for the purpose of performing high speed data transmission. In some cases, the number of I/Os accessing at one time is equal to or more than 256 bits. When the number of I/Os is 256 bits, for example, it is expressed as "×256 bits", which means that there are 256 (512 in both True and Bar) common data lines DBus (True/Bar).

However, it is difficult to make the DRAM part (eDRAM) larger because total chip area of the system LSI is limited. Accordingly, the size of the eDRAM cannot be made larger despite the fact that the number of I/Os accessing at one time between the controller and the DRAM has been on the increase as described above. In other words, the ratio of the number of memory cells in which the data is rewritten to the number of memory cells in which the data is not rewritten increases in accessing the memory.

As shown in FIGS. 9 and 10, the HVDD power source 930 is connected to the capacitors of all the memory cells of the DRAM 900. When the number of I/Os accessing the memory cells at one time is small, a parasitic capacity between the capacitor of the memory cell in which the data is not rewritten and the HVDD power source 930 is sufficiently large with respect to the noise current; therefore there is no problem raised even when the ability of the HVDD power source 930 is not so high. However, in a case where the voltage fluctuation due to the rewriting of the data from the H level to the L level is caused in the cell node as described above when the ratio of the number of memory cells in which the data is rewritten to the number of memory cells in which the data is not rewritten is large, as an example, the influence of the noise current generated by the voltage fluctuation on the HVDD power source 930 cannot be ignored. Since the noise current fluctuates the output voltage of the HVDD power source 930, the cell nodes in the counter plates of all the capacitors connected to the HVDD power source 930 are influenced. This may cause degradation of quality of the data held in the capacitor of the memory cell.

Furthermore, since the manufacturing process has been miniaturized in recent years, the power supply voltage VDD, and the reference voltage HVDD which is VDD/2 have also been decreasing. Therefore, the noise described above influences more on the HVDD power source outputting the reference voltage which has been decreasing.

In order to overcome this problem, it would be effective to increase response speed or a number of stabilizing capacitors for removing ripple of the HVDD power source. However, an area of a decoupling capacitor needs to be increased in order to increase the number of stabilizing capacitors. Furthermore, the response of the voltage determination circuit in the HVDD power source needs to be enhanced in order to increase the response speed, which increases the power consumption of the amplifier of the voltage determination circuit. Accordingly, the power consumption of the semiconductor storage device or the area required in the semiconductor storage device increases, which causes an adverse effect.

Japanese Unexamined Patent Application Publication No. 2002-184173 discloses a technique capable of reducing coupling noise on a cell plate voltage line. In this technique, a memory array includes a main cell and a dummy cell, and inversion data of the data written into the main cell is written into the dummy cell. However, according to this technique, the noise can further be produced before writing depending on the data.

As stated above, according to the semiconductor storage device in the related art, the noise current is generated in the reference voltage power source which is capacity-coupled to the counter plate of the capacitor of the cell node due to the voltage fluctuation of the cell node generated when the data held in the memory cell is rewritten, which makes the output voltage of the reference voltage power source unstable.

SUMMARY

A semiconductor storage device according to one aspect of the present invention includes a reference voltage source connected to a capacitor of a cell included in a memory, a buffer circuit holding data to be written in the cell, and a counter noise generator outputting a counter noise current canceling a noise current generated by rewriting the data in the cell to the reference voltage source according to the data held in the buffer circuit.

According to the semiconductor storage device of the present invention, it is possible to cancel the noise current generated due to the voltage fluctuation of a counter plate of a capacitor when the data is written in the memory cell by the counter noise current from the counter noise generator, whereby the influence of the noise current on the reference voltage power source can be reduced.

According to the semiconductor storage device of the present invention, it is possible to reduce the noise current generated due to the voltage fluctuation of the cell node with respect to the reference voltage power source when the data held in the memory cell is rewritten, whereby an output voltage of the reference voltage power source can be made stable.

BRIEF DESCRIPTION OF THE DRAWINGS

The above and other objects and advantages and features of the present invention will be more apparent from the following description of certain preferred embodiments taken in conjunction with the accompanying drawings, in which:

FIG. 8 shows one example of a table showing a relation between a counter noise current and written data in a buffer circuit in the semiconductor storage device according to the second embodiment;

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

The first embodiment to which the present invention is applied will now be described in detail with reference to the drawings. The first embodiment is the one in which the present invention is applied to the DRAM.

Figure 1:
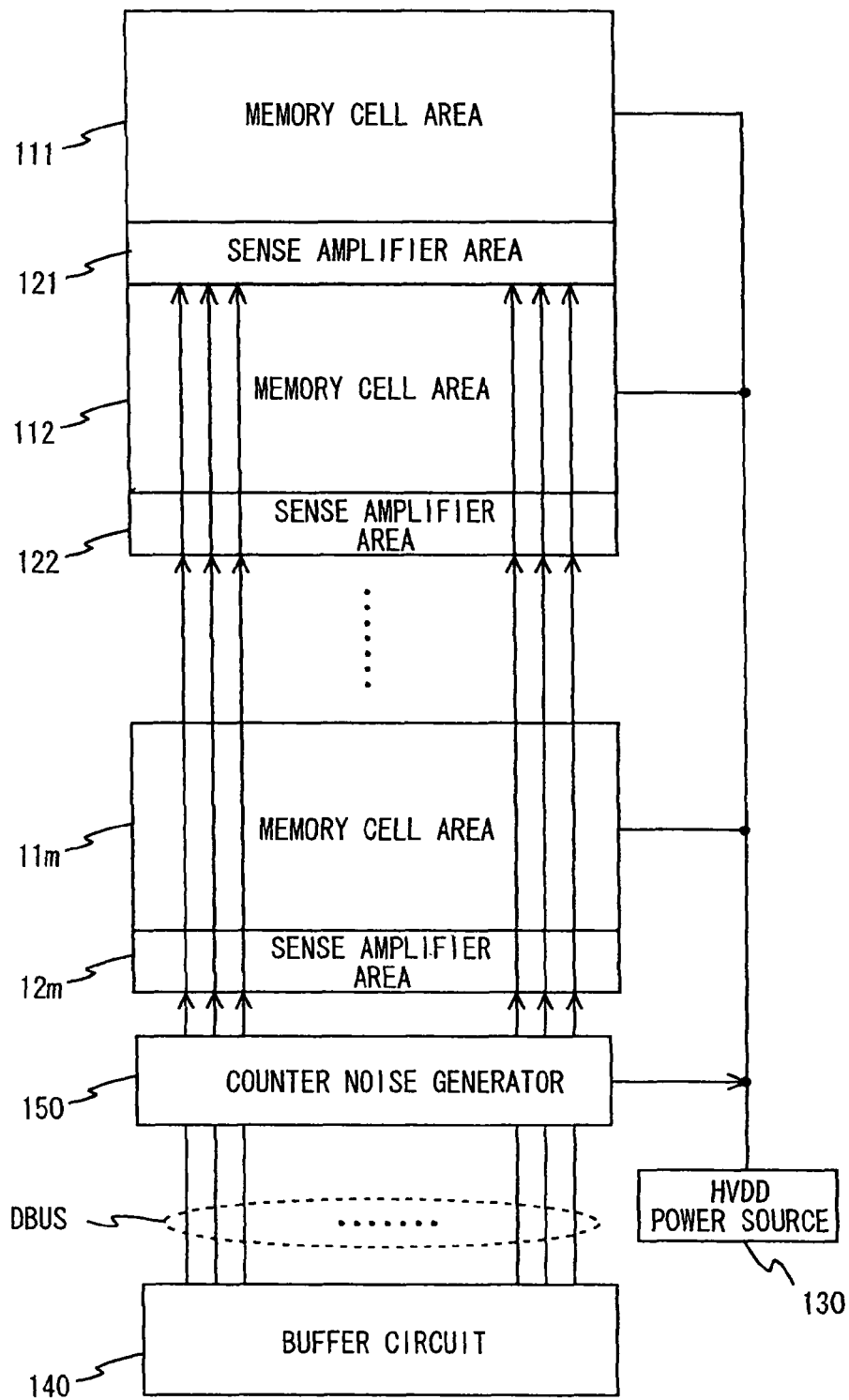
FIG. 1 shows one example of a circuit configuration of a semiconductor storage device according to a first embodiment.

FIG. 1 shows one example of a schematic configuration diagram of a DRAM 100. The DRAM 100 includes memory cell areas 111, 112, . . . , 11m where a plurality of memory cells are arranged, sense amplifier areas 121, 122, . . . , 12m, an HVDD power source 130 having an output voltage of VDD/2, a buffer circuit 140 (buffer circuit in a broad sense), and a counter noise generator 150. Data written into the memory cell is transferred to the memory areas (111, 112, . . . , 11m) from the buffer circuit 140 through each of the sense amplifier areas (121, 122, . . . , 12m) by common data lines DBus (True/Bar). When the number of I/Os is "×256 bits", for example, it means that there are 256 common data lines DBus (True/Bar) or 512 lines with both of the True and Bar.

Figure 2:
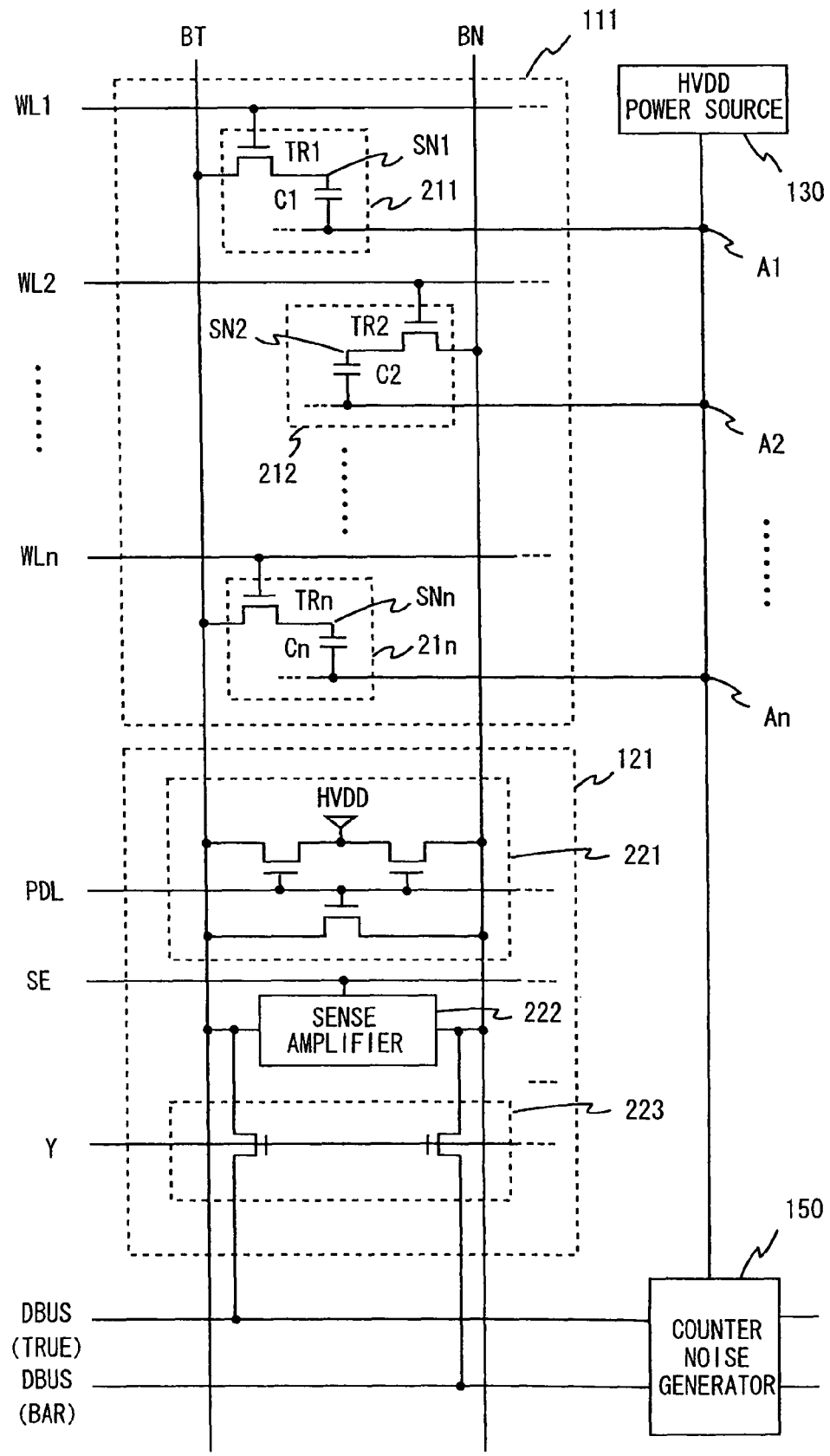
FIG. 2 shows one example of a circuit configuration of a memory cell area and a sense amplifier area of the semiconductor storage device according to the first embodiment.

FIG. 2 shows a circuit configuration diagram of the memory cell area 111 and the sense amplifier area 121 as one example of the memory cell areas and the sense amplifier areas. As shown in FIG. 2, the memory cell area 111 includes memory cells 211, 212, . . . , 21n connected to a bit line BT or BN. The sense amplifier area 121 includes an equalizer 221, a sense amplifier 222, and a column selector 223.

The memory cells 211, 212, . . . , 21n include gate transistors Tr1, Tr2, . . . , Trn and capacitors C1, C2, . . . , Cn, respectively. For example, in the memory cell area 111, the gate transistor Tr1 includes a gate connected to a word line WL1, one of a drain and a source connected to the bit line BT, and the other of the drain and the source connected to one terminal of the capacitor C1 through a cell node SN1. When the gate transistor Tr1 is turned on, VPP which is higher than power supply voltage is applied to the word line WL1 as a word select signal. On the other hand, when the gate transistor Tr1 is turned off, VKK which is lower than ground voltage is applied. The other terminal of the capacitor C1 is connected to the HVDD power source 130. The memory cells 212, . . . , 21n also have the similar configurations as described above. Some memory cells such as the memory cell 212 are connected to the bit line BN.

The equalizer 221 charges a voltage of the complementary bit line pair BT/BN to VDD/2 according to an equalizer control signal PDL.

The sense amplifier 222 is connected to the complementary bit lines BT, BN. The sense amplifier 222 amplifies a potential difference of the complementary bit lines BT and BN according to the sense amplifier control signal SE and outputs the amplified result.

The column selector 223 connects the complementary bit line pair BT/BN and the common data lines DBus (True/Bar) according to the column select signal Y.

As shown in FIG. 2, in the present embodiment, the memory cells are arranged in n lines in a row direction and one line in a column direction for the sake of simplicity. However, it is also possible to increase the number of memory cells in the column direction so that the memory cells are arranged in matrix form. In this case, the number of column selectors selecting the plurality of memory cells in each column unit, and the number of sense amplifiers and equalizers corresponding to the complementary bit line pair transmitting the information of each memory cell are needed to be increased in accordance with the number of memory cells. The memory cell areas 112, . . . , 11m and the sense amplifier areas 122, . . . , 12m also have the same configuration.

The HVDD power source 130 (reference voltage power supply in a broad sense) outputs voltage (VDD/2) which is half the magnitude of the power supply voltage VDD as the reference voltage, and is connected to the capacitors C1, C2, . . . , Cn of each of the memory cells 211, 212, . . . , 21n through nodes A1, A2, . . . , An. When the cell node of the memory cell is lower than this voltage, the memory cell holds data of "L" (which means the potential of the cell node is in the L level). On the other hand, when the cell node of the memory cell is higher than this voltage, the memory cell holds data of "H" (which means the potential of the cell node is in the H level). The memory cell areas 112, . . . , 11m and the sense amplifier areas 122, . . . , 12m also have the same configuration as described above.

The buffer circuit 140 temporarily holds written data which is to be transmitted to the memory cell through the common data lines. The buffer circuit 140 further outputs the written data which is held therein to the common data lines according to a write control signal WRITE and drives the common data lines and the bit lines.

The counter noise generator 150 is arranged between the common data lines connecting the sense amplifiers (121, . . . , 12m) and the buffer circuit 140 as shown in FIG. 1. As shown in FIG. 2, the HVDD power source 130 and the capacitors C1, C2, . . . , Cn are connected through the nodes A1, A2, . . . , An in the memory cell area 111. The counter noise generator 150 outputs current obtained by inverting a phase of the noise current generated by voltage fluctuation of the cell node due to the rewriting of the data into the memory cell as a counter noise current. Further, the current amount of the counter noise current output from the counter noise generator 150 is determined using write data held in the buffer circuit 140.

Figure 3A:
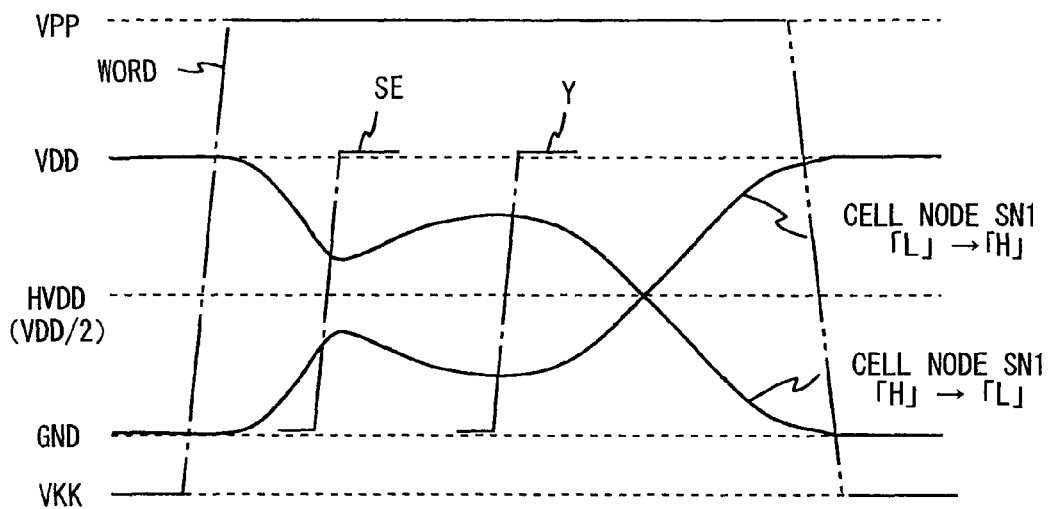
FIGS. 3A to 3C show an example of a pattern of data written in the memory cell in the semiconductor storage device according to the first embodiment.
Figure 3B:
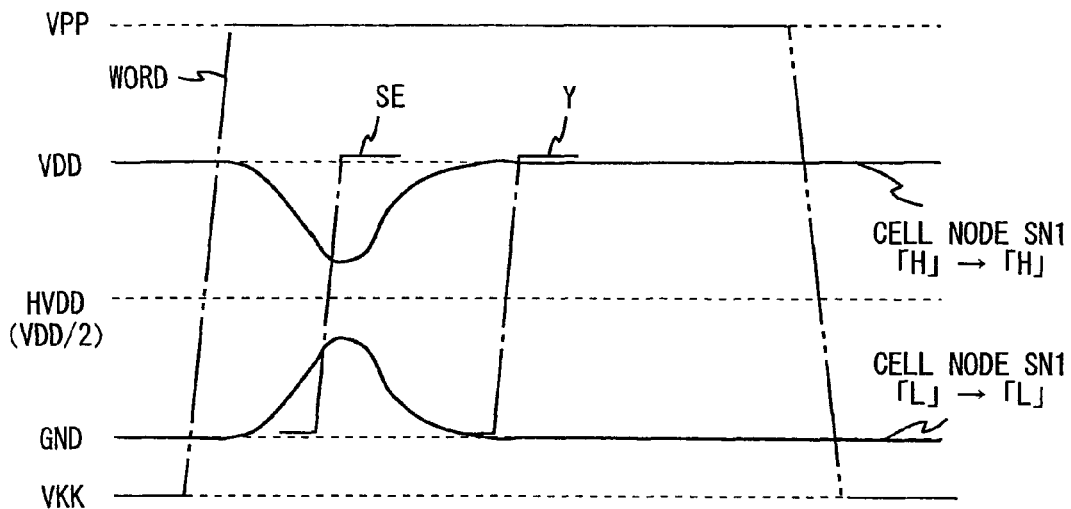
Figure 3C:
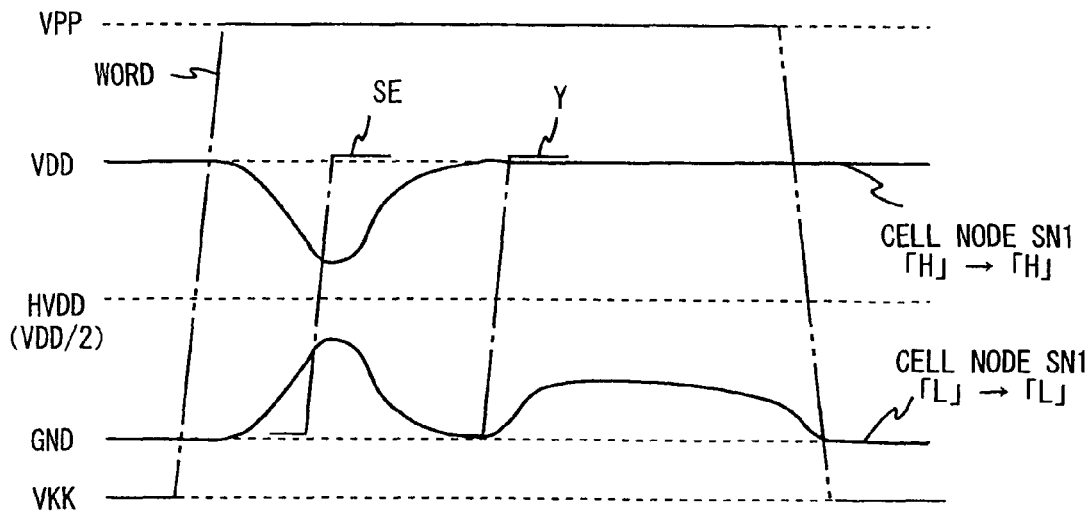

Now, data writing patterns in the memory cell will be described in brief. The data may be rewritten in the memory cell from the H level to the L level, or from the L level to the H level, as shown in FIG. 3A. Alternatively, the data may be rewritten from the H level to the H level, or from the L level to the L level, as shown in FIG. 3B. Further, there is also the writing operation for compensating the decreased charge along with the reading of the data held in the memory cell, as shown in FIG. 3C. There is also a rewriting operation by a refresh operation of the DRAM; in this case, the writing pattern is the same as that shown in FIG. 3B. WORD in FIG. 3 indicates a word select signal, SE indicates a sense amplifier control signal, and Y indicates a column select signal.

When the data is rewritten from the H level to the H level or from the L level to the L level as shown in FIG. 3B, a part of the voltage fluctuates. However, in this case, the voltage level of the cell node is not inverted. Therefore, there is produced no noise current which is transferred to a counter plate of the capacitor. Since the refresh operation occurred in a predetermined cycle is the same as that shown in FIG. 3B, there is generated no noise current. Further, the voltage level of the cell node is not inverted also in the operation of reading the data held in the memory cell as shown in FIG. 3C; therefore there is produced little noise current transferred to the counter plate of the capacitor.

Contrary to FIGS. 3B and 3C, in the pattern of FIG. 3A, there is caused a voltage fluctuation of the cell node by writing the data in the memory cell, which produces the noise current to the HVDD power source, as described in the related art. Therefore, the writing pattern in which the counter noise generator 150 outputs the current obtained by inverting the phase of the noise current as the counter noise current is limited to the case shown in FIG. 3A. Hereinafter, only the operation in the pattern shown in FIG. 3A will be called "rewriting" so as to make a distinction from the "writing" operation which includes writing of the data having no fluctuation in the voltage level as in the patterns shown in FIGS. 3B and 3C. Note that this "writing" operation also includes the pattern of FIG. 3A.

However, when the rewriting operation from the H level to the L level and from the L level to the H level shown in FIG. 3A is performed in two different memory cells at the same time in the DRAM 100, for example, the generated noise currents are cancelled with each other since the noise currents have different phases with each other. Therefore, the current amount of the counter noise current output from the counter noise generator 150 is determined as follows. First, the data held in the memory cell is compared with the written data held in the buffer circuit 140. Then the number of memory cells subjected to the rewriting from the H level to the L level and the number of the memory cells subjected to the rewriting from the L level to the H level are determined and its difference is calculated. Then the current amount of the counter noise current is determined based on the calculated value.

Now, the noise current produced by rewriting the data from the H level to the L level in one memory cell is set to "−1". The current amount supplied from the counter noise generator 150 to the HVDD power source 130 is set to the counter noise current "+1" in order to cancel the noise current "−1". Therefore, the counter noise current "+2" is the current amount of the counter noise current canceling the noise current "−2" of two memory cells generated by rewriting the data from the H level to the L level.

On the other hand, the noise current generated by rewriting the data from the L level to the H level in one memory cell is set to "+1". Accordingly, the current amount absorbed by the counter noise generator 150 from the HVDD power source 130 is set to the counter noise current "−1" in order to cancel the noise current "+1".

Now we consider a case in which the number of memory cells where the data is rewritten from the H level to the L level is "6" (noise current "−6" is generated) and the number of memory cells where the data is rewritten from the L level to the H level is "2" (noise current "+2" is generated), for example. In this case, the difference of the noise current is "−4"; therefore the counter noise generator 150 supplies the current amount of the counter noise current "+4" to the HVDD power source 130.

We also consider another example in which the number of memory cells where the data is rewritten from the H level to the L level is "1" (noise current "−1" is generated) and the number of memory cells where the data is rewritten from the L level to the H level is "7" (noise current "+7" is generated). In this case, the difference of the noise current is "+6". Therefore, the counter noise generator 150 in this case absorbs the current amount "−6" as the counter noise current from the HVDD power source 130.

Figure 4:
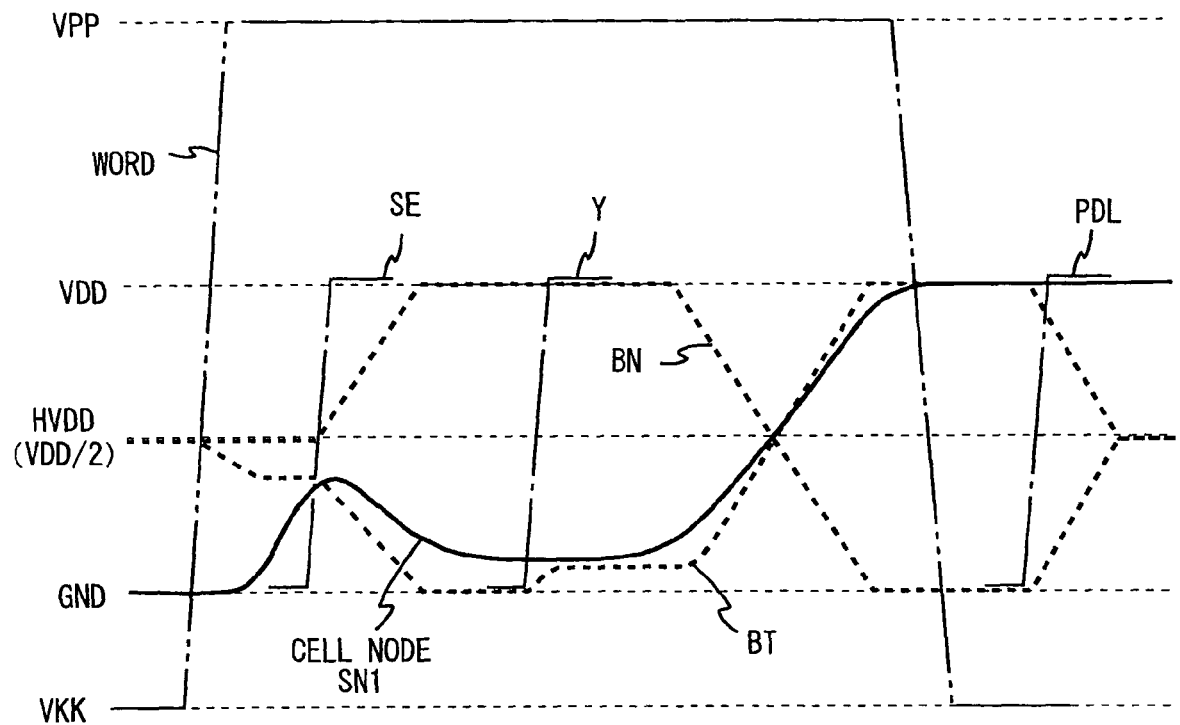
FIG. 4 shows one example of a timing chart of an operation of the semiconductor storage device according to the first embodiment.
Figure 4:
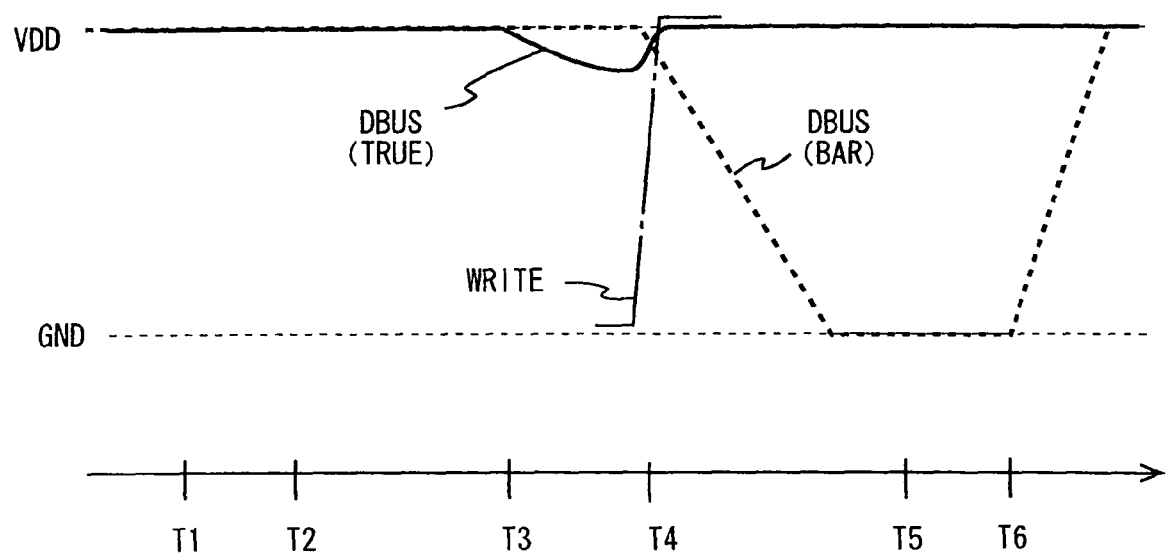

Referring now to FIG. 4 showing a timing chart of the circuit of FIG. 2, the operation will be described. The description will be made on a case in which the "L" data is held in the memory cell 211 (voltage of the cell node SN1 is in the L level (GND)) and the held data is rewritten to "H" (voltage of the cell node SN1 is in the L level (VDD)). The rewriting pattern shown in FIG. 4 corresponds to the rewriting pattern from the L level to the H level shown in FIG. 3A.

First, as shown in FIG. 4, before the time t1, the word select signal WORD of the word line WL1 is in the L level, and the gate transistor Tr1 of the memory cell 211 is in off state. Therefore, the capacitor C1 and the bit line BT are disconnected. Accordingly, the voltage of the cell node SN1 is in the L level (GND). The voltage of the bit line BT is charged to be VDD/2 by the equalizer 221. The potential of the common bit line pair DBus (True/Bar) is charged to be the H level (VDD).

Next, at the time t1 to t2, the word select signal WORD of the word line WL1 is raised. Then the gate transistor Tr1 of the memory cell 211 is turned on, and the capacitor C1 and the bit line BT are connected. Then the current flows from the bit line BT to the capacitor C1 to increase the potential of the cell node SN1. On the other hand, the potential of the bit line BT decreases from VDD/2.

Next, at the time t2 to t3, the sense amplifier control signal SE is raised so that the sense amplifier 222 starts the operation. Therefore, the potential difference of the complementary bit line pair BT/BN is amplified. Accordingly, the potential of the bit line BT further decreases to be GND. Further, the potential of the BN increases to be VDD. The potential of the cell node SN1 further decreases.

At the time t3 to t4, the column select signal Y is raised and the gate transistor of the column selector 223 is turned on. Therefore, the complementary bit line pair BT/BN and the common bit line pair DBus (True/Bar) are connected. At this time, the potential of the bit line BT is GND, so that the potential of the common bit line DBus (True) decreases. On the other hand, the potential of the common bit line DBus (Bar) keeps VDD. When the potential of the common bit line DBus (True) decreases, it means that the data held in the memory cell 211 is in the L level, and the information is temporarily stored in the counter noise generator 150.

At the time t4 to t5, the writing control signal WRITE is raised, and the written data is output from the buffer circuit 140. Therefore the common bit line DBus (True) is in the H level (VDD) and the DBus (Bar) is in the L level (GND). Therefore, the H level (VDD) of the common bit line DBus (True) is transmitted to the bit line BT. Since there is a difference in an ability of the amplifier between the buffer circuit 140 and the sense amplifier 222, the potential of the bit line BT inverts from the L level (GND) to the H level (VDD). Further, the potential of the cell node SN1 also increases to be inverted to the H level (VDD), and the charge is charged in the capacitor C1 from the cell node SN1 side. At the same time, the data output to the common bit line DBus is received by the counter noise generator 150 to compare this data with the information stored at the time t3 to t4. More specifically, the information indicating that the common bit line DBus (True) output from the buffer circuit 140 is in the H level is compared with the information indicating that the held data which is stored in the memory cell 211 at the time t3 to t4 is in the L level. The counter noise generator 150 determines that the data in the memory cell 211 is actually rewritten.

Now we consider a case in which the buffer circuit 140 outputs the L level (GND) to the common bit line DBus (True), which is the writing pattern from the L level to the L level as shown in FIG. 3B. In this case, the information indicating that the held data stored in the memory cell at the time t3 to t4 is in the L level is compared with the information indicating that the common bit line DBus (True) output from the buffer circuit 140 is in the L level. Then the counter noise generator 150 determines that "rewriting" of the data in the memory cell 211 is not performed.

At the time t5 to t6, the word select signal WORD is fallen. Therefore, the gate transistor Tr1 of the memory cell 211 is turned off again, and the capacitor C1 and the bit line BT are disconnected. At the same time, the sense amplifier control signal SE and the column select signal Y are fallen, and the sense amplifier 222 and the column selector 223 stop the operation. Accordingly, the potential of the cell node SN1 is held in the L level (GND) and the memory cell 211 holds the L level data.

After the time t6, the equalizer control signal PDL is raised, and the equalizer 221 starts the operation. Therefore, the complementary bit line pair BT/BN is charged by the equalizer 221 so that the voltage again becomes VDD/2. The common bit line pair DBus (True/Bar) is also charged so that the voltage again becomes VDD. Then the rewriting of the data held in the memory cell 211 from "L" to "H" is completed.

After completing rewriting of the data in the memory cell, the counter noise generator 150 outputs the counter noise current "−1" to the HVDD power source 130 at the time t5 or t6, for example, based on the information obtained between the time t4 and t5. Therefore, the counter noise generator 150 absorbs the noise current. The timing at which the counter noise generator 150 outputs the counter noise current is not necessarily limited to the rewriting operation cycle described above. This is because the timing at which the noise current is generated depends on a parasitic capacity of a wiring among the capacitor of each memory cell, the HVDD power source 130, and the counter noise generator 150, or a resistance of the wiring. Therefore, in some circuit configurations, the timing at which the counter noise generator 150 outputs the counter noise current may not be the receiving operation cycle described above but may be a timing of a next cycle or a cycle of the next cycle. However, if this timing is too late, the potential of the HVDD power source 130 maybe fluctuated. When the counter noise current is output in the next cycle or in the cycle of the next cycle, one cycle of the rewriting operation is not unduly made long due to the waiting time that is needed to generate the counter noise current by the counter noise generator 150. Therefore, the operation speed of the DRAM is not so decreased.

Figure 5:
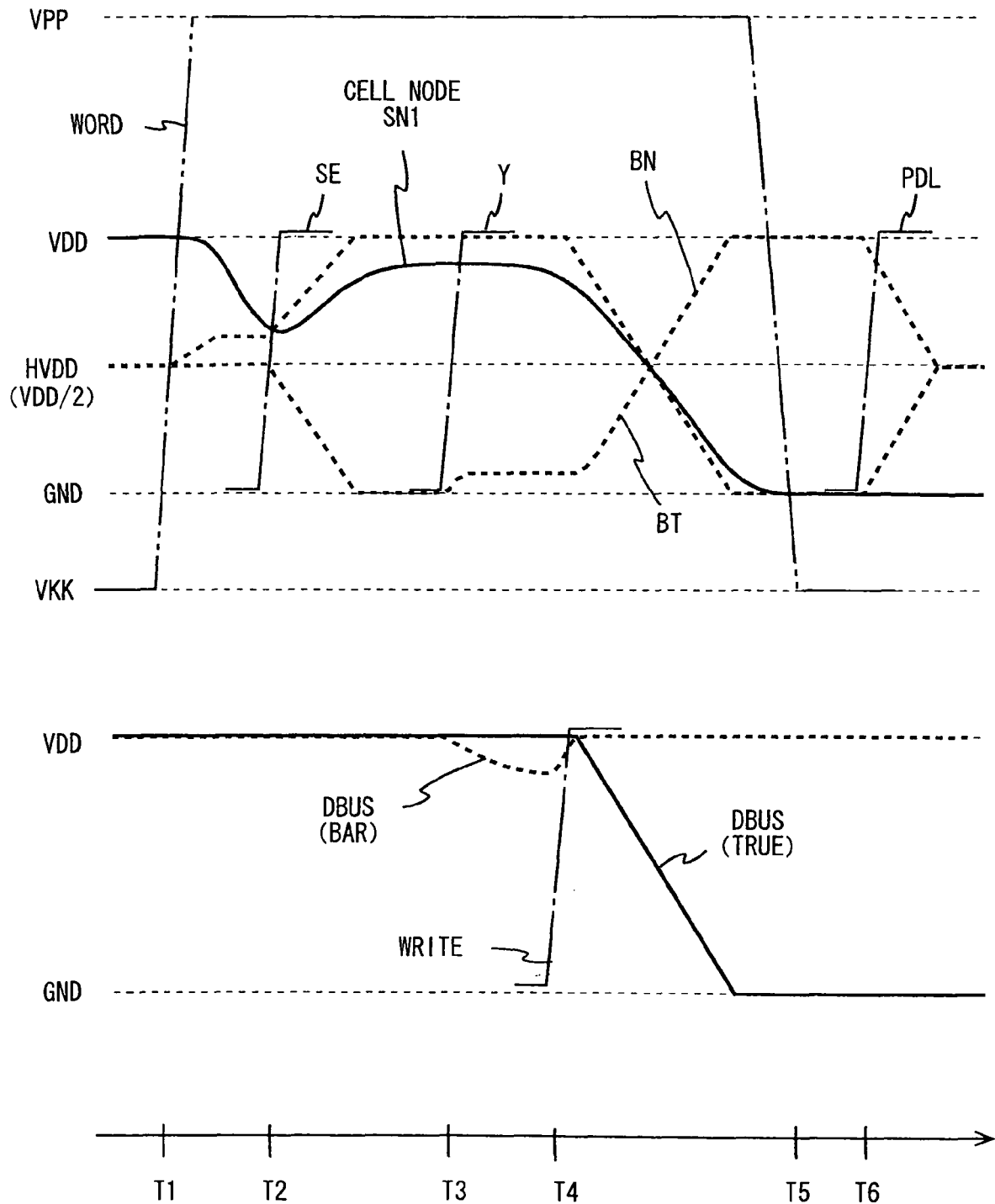
FIG. 5 shows one example of a timing chart of an operation of the semiconductor storage device according to the first embodiment.

FIG. 5 shows a timing chart of a case where a state in which the "H" data is held in the memory cell 211 and the voltage of the cell node SN1 is in the H level (VDD) is changed to a state in which the held data is rewritten to the "L" data and the voltage of the cell node SN1 is changed to the L level (GND). In this case, only the relation of the potential of the cell node SN1 in the description of FIG. 4 is inverted; therefore the description of the operation will be omitted. However, the potential of the common bit line DBus (True) at the time t3 to t4 keeps H level (VDD). Therefore, when there is no change in the potential of the common bit line DBus (True), it means that the data held in the memory cell 211 is in the H level. Therefore, this information is stored in the counter noise generator 150 as is the same as in the description of the operation shown in FIG. 4. Accordingly, the counter noise generator 150 outputs the counter noise current "+1" to the HVDD power source 130 after performing rewriting at the time t5 or t6 based on the information that the data of the memory cell is rewritten from "H" to "L" determined at the time t4 to t5, for example. In summary, the counter noise generator 150 supplies the current.

Although only the rewriting operation of the memory cell area 111 and the sense amplifier area 121 in FIG. 2 is described as the operation of the present invention, the rewriting operation is actually performed in a whole circuit of the DRAM 100 shown in FIG. 1. There are several kinds of patterns of the written data as shown in FIGS. 3A and 3B. Therefore, the counter noise generator 150 compares the information of the held data in the memory cell obtained from each memory cell area 111, ..., 11m shown in FIG. 1 at the time t3 to t4 with the output data of the buffer circuit 140 output to the common bit line DBus at the time t4 to t5 to determine whether each memory cell "rewrites" data. Further, it is determined whether the "rewriting" operation of the data in each memory cell is from the L level to the H level or from the H level to the L level. Further, a difference between the number of data rewritten from the L level to the H level and the number of data rewritten from the H level to the L level is determined. Then the current amount of the counter noise current according to the difference is output to the HVDD power source 130. More specifically, when the number of memory cells in which the data is rewritten from the H level to the L level is "10" (noise current "−10" is generated) and the number of memory cells in which the data is rewritten from the L level to the H level is "2" (noise current "+2" is generated), the counter noise generator 150 supplies the current amount of the counter noise current "+8" to the HVDD power source 130.

In the related art, when the potential of each cell node is inverted by rewriting the data of the memory cell in the DRAM 100, for example at the time t3 to t4 in FIG. 4, the noise current influences on the HVDD voltage source due to the voltage change of the cell node, and this current needs to be absorbed or supplied by the HVDD voltage source 130, which places a burden on the power source. On the other hand, in the first embodiment according to the present invention, the absorption or the supply of the noise current generated by rewriting the data of the memory cell is executed by the counter noise generator 150. Therefore, it is possible to cancel the noise current which places a burden on the HVDD voltage source 130. Therefore, there is no burden for the HVDD voltage source 130, whereby the HVDD voltage source 130 can stably supply the reference voltage HVDD as the output voltage.

Second Embodiment

The second embodiment to which the present invention is applied will be described in detail with reference to the drawings. The second embodiment is the one in which the present invention is applied to the DRAM as the same as in the first embodiment. The configuration in the second embodiment is substantially the same as that in the first embodiment except that the current amount of the counter noise current output from the counter noise generator 150 is calculated only from the written data held in the buffer circuit 140. Therefore, the circuit configuration is the same as in FIGS. 1 and 2 described in the first embodiment. In the second embodiment, only a part which is different from the first embodiment will be described, and the description of the circuit configuration or the like will be omitted.

Figure 6:
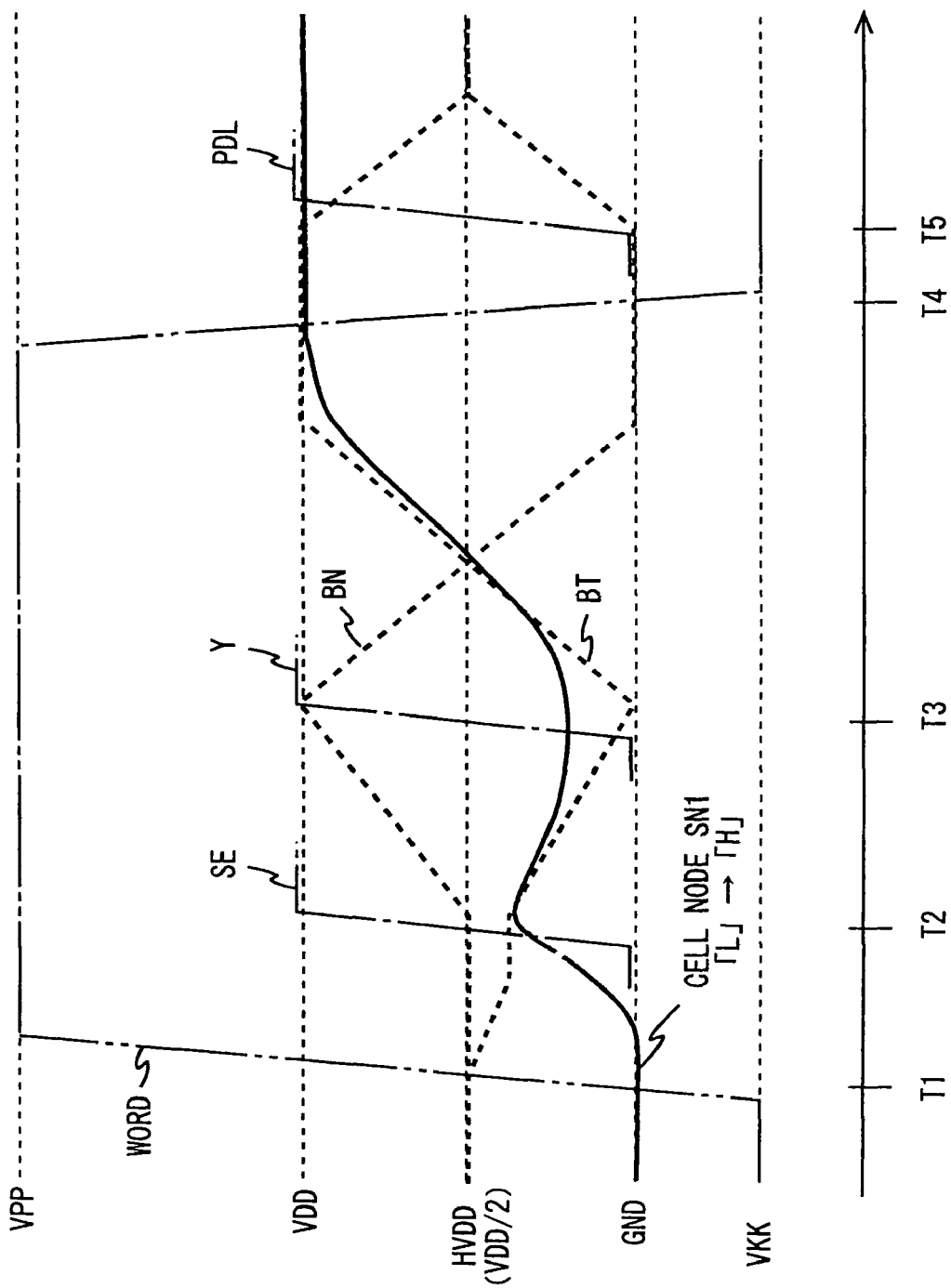
FIG. 6 shows one example of a timing chart of an operation of a semiconductor storage device according to a second embodiment.

FIG. 6 shows a timing chart showing a circuit operation of FIG. 2 in the second embodiment. Now, a case will be described in which the "L" data is held in the memory cell 211 (voltage of the cell node SN1 is in the L level (GND)) and the data is rewritten to "H" (voltage of the cell node SN1 is in the H level (VDD)).

First, before the time t1, the word select signal WORD of the word line WL1 is in the L level as shown in FIG. 6. Therefore, the gate transistor Tr1 of the memory cell 211 is in the off state, and the capacitor C1 and the bit line BT are disconnected. At this time, the voltage of the cell node SN1 is in the L level (GND) The voltage of the bit line BT is charged to be VDD/2 by the equalizer 221. The potential of the common bit line pair DBus (True/Bar) is charged to be the H level (VDD).

Next, at the time t1 to t2, the word select signal WORD of the word line WL1 is raised. Therefore, the gate transistor Tr1 of the memory cell 211 is turned on and the capacitor C1 and the bit line BT are connected. Accordingly, the current flows from the bit line BT to the capacitor C1, which increases the potential of the cell node SN1. On the other hand, the potential of the bit line BT decreases from VDD/2.

Next, at the time t2 to t3, the sense amplifier control signal SE is raised and the sense amplifier 222 starts the operation. Therefore, the potential difference of the complementary bit line pair BT/BN is amplified. Accordingly, the potential of the bit line BT decreases to be GND, and the potential of the bit line BN increases to be VDD. The potential of the cell node SN1 also decreases.

Next, at the time t3 to t4, the column select signal Y is raised and the gate transistor of the column selector is turned on. Therefore, the complementary bit line pair BT/BN and the common bit line pair DBus (True/Bar) are connected. The written data output from the buffer circuit 140 is output to the common bit line pair DBus (True/Bar), and the potential of the common bit line DBus (True) is in the H level (VDD) and the potential of the DBus (Bar) is in the L level (GND). Therefore, the H level (VDD) of the common bit line DBus (True) is transmitted to the bit line BT. Since there is a difference in the ability of the amplifier between the buffer circuit 140 and the sense amplifier 222, the potential of the bit line BT inverts from the L level (GND) to the H level (VDD). The potential of the cell node SN1 also increases and inverts to the H level (VDD) so that the charge is charged in the capacitor C1 of the memory cell 211 from the cell node SN1 side.

Next, at the time t4 to t5, the word select signal WORD is fallen. Therefore, the gate transistor Tr1 of the memory cell 211 is also turned off again so that the capacitor C1 and the bit line BT are disconnected. At the same time, the sense amplifier control signal SE and the column select signal Y are fallen so that the sense amplifier 222 and the column selector 223 stop the operation. Therefore, the potential of the cell node SN1 is kept in the H level (VDD) and the memory cell 211 keeps the "H" level data.

Next, after the time t5, the equalizer control signal PDL is raised and the equalizer 221 starts the operation. Therefore, the complementary bit line pair BT and BN is charged by the equalizer 221 so that the voltage becomes VDD/2 again. The rewriting of the data held in the memory cell 211 is thus completed.

Figure 7:
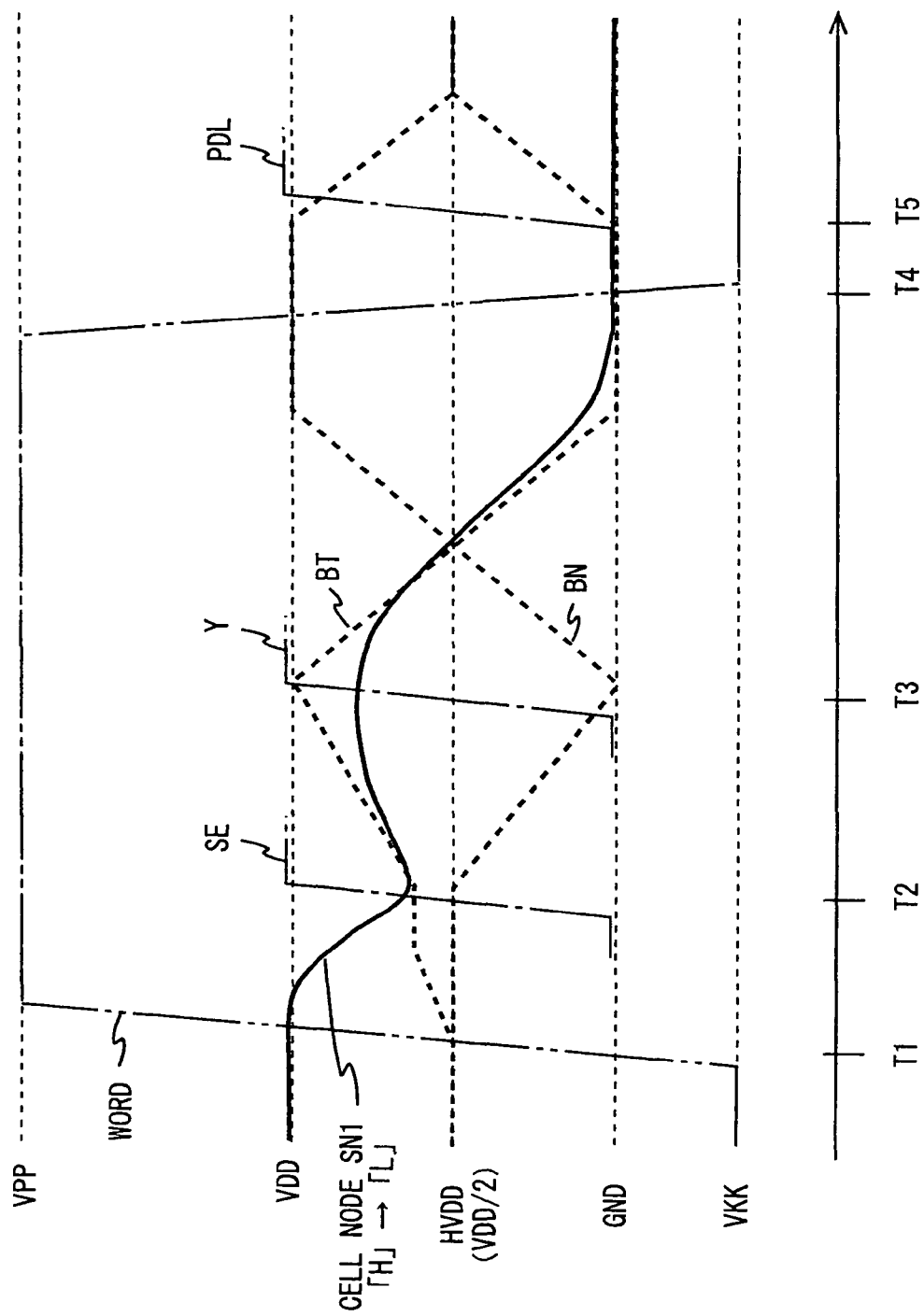
FIG. 7 shows one example of a timing chart of an operation of the semiconductor storage device according to the second embodiment.
Figure 9:
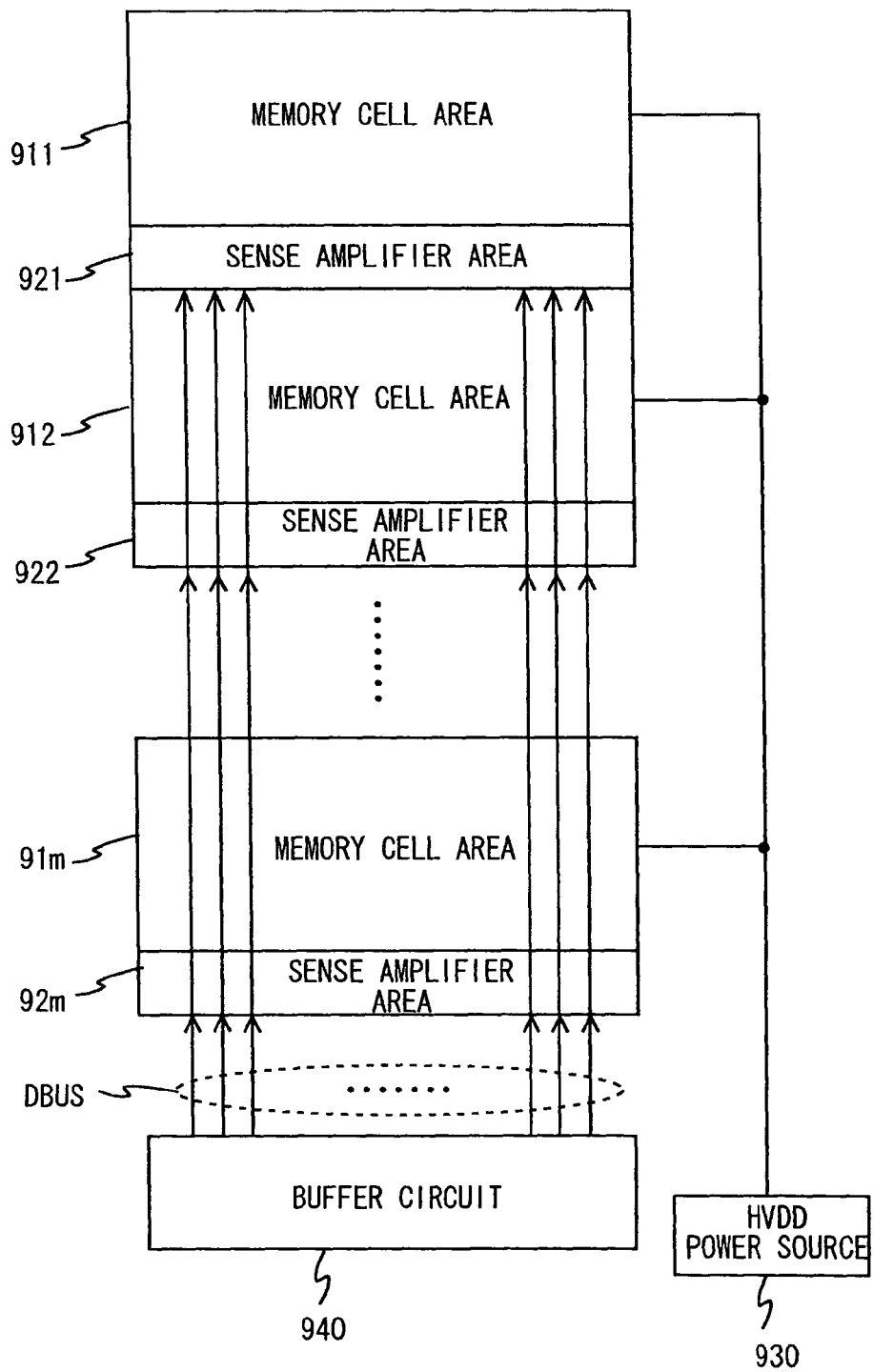
FIG. 9 shows one example of a circuit configuration of a semiconductor storage device according to a related art.
Figure 10:
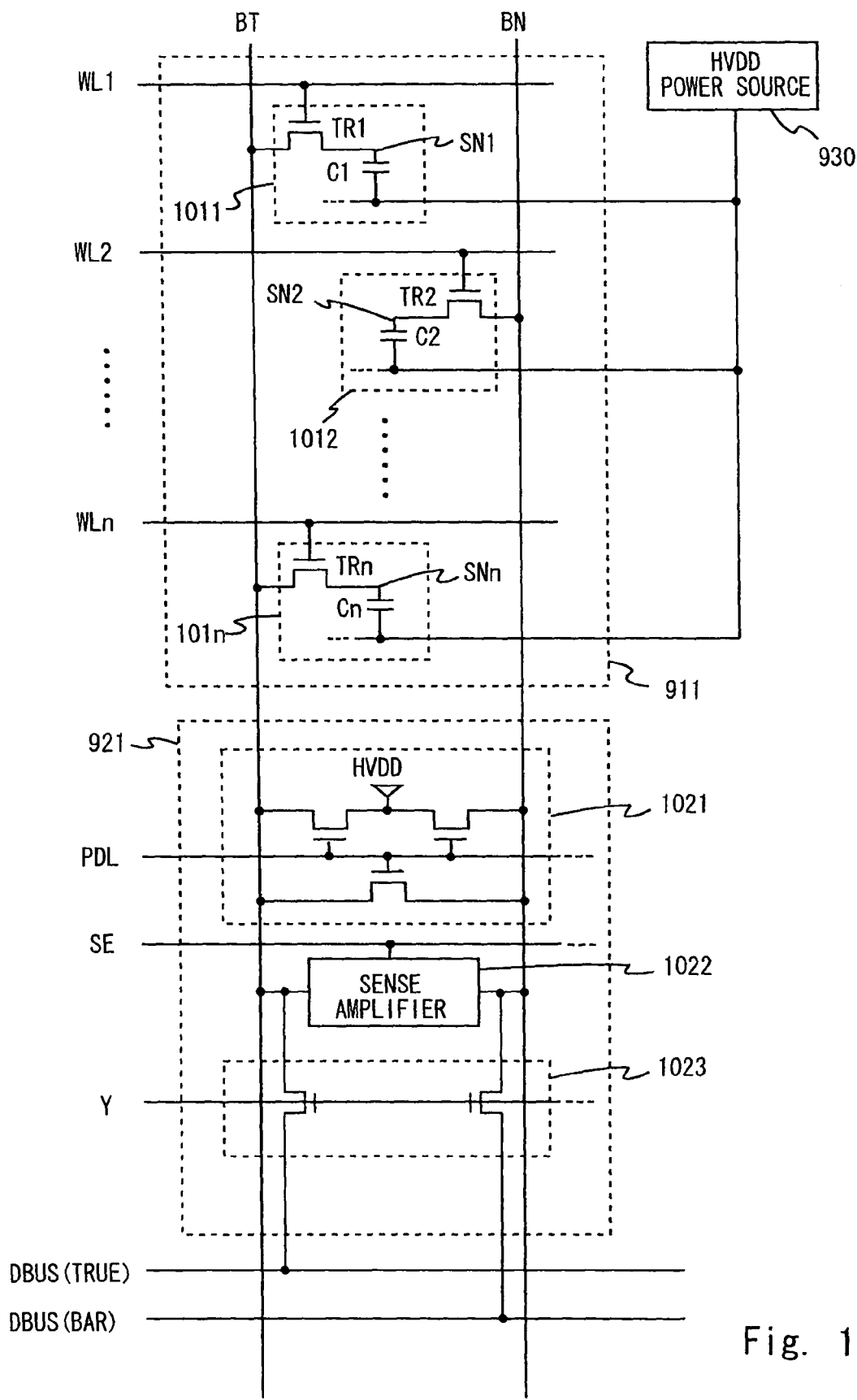
FIG. 10 shows one example of a circuit configuration of a memory cell area and a sense amplifier area of the semiconductor storage device according to the related art.

FIG. 7 shows a timing chart of a case where a state in which the "H" data is held in the memory cell 211 and the voltage of the cell node SN1 is in the H level (VDD) is changed to a state in which the data is rewritten to "L" and the voltage of the cell node SN1 is changed to the L level (GND). In this case, only the relation of the potential of the cell node SN1 or the like in the description of FIG. 6 is inverted; therefore the description of the operation will be omitted.

Only the rewriting operation of the memory cell area 111 and the sense amplifier area 121 of FIG. 2 is described as the operation according to the present invention as is the same as in the first embodiment. However, the rewriting operation is actually performed in a whole circuit of the DRAM 100 shown in FIG. 1. Therefore, the counter noise generator 150 reads out all the written data held in the buffer circuit 140 in advance before the data is written into the memory cell, or before the time t3, for example. Then the difference between the number of "H" data and the number of "L" data of the written data is obtained. The counter noise generator 150 further calculates a value of ½ of its difference. Further, the counter noise generator 150 regards that the noise current corresponding to the value of the calculating result is generated and outputs the counter noise current corresponding to the value of the calculating result after the rewriting operation at the time t4 or t5, for example.

The timing at which the counter noise generator 150 outputs the counter noise current may not be the rewriting operation cycle as described above but may be a timing of the next cycle as is the same as in the first embodiment. In this case, the cycle of the writing operation is not unduly made long, which means there is no degradation of the operation speed of the DRAM.

Now, FIG. 8 shows an example of a method of determining the current amount of the counter noise current output from the counter noise generator 150. In FIG. 8, the number of I/Os is "×8 bits". For example, when the number of written data in the H level is "7" and the number of written data in the L level is "1" as shown in FIG. 8 (a), the difference is "+6" and the value of ½ is "+3". Therefore, the counter noise generator 150 regards that the noise current "+3" is generated and outputs the counter noise current "−3" to the HVDD power source 130. Accordingly, the counter noise generator 150 absorbs the current from the HVDD power source 130.

When the number of written data in the L level is "4" and the number of written data in the H level is "4" as shown in FIG. 8(b), the difference is "0", which means that the counter noise current is not output from the counter noise generator 150.

Further, when the number of written data in the H level is "2" and the number of written data in the L level is "6" as shown in FIG. 8(c), the difference is "−4" and the value of ½ is "−2". Therefore, the counter noise generator 150 regards that the noise current of "−2" is generated and outputs the counter noise current "+2" to the HVDD power source 130. Therefore, the counter noise generator 150 supplies the current to the HVDD power source 130.

Now, the reason why the difference of the number of written data in the H level and the number of written data in the L level is set to ½ will be described. In the method of determining the current amount of the counter noise current according to the second embodiment, the data of the memory cell held before the data writing is not employed but only the written data held in the buffer circuit 140 is employed unlike the first embodiment. It does not mean that only the pattern in which the data is actually rewritten from the H level to the L level or from the L level to the H level is targeted in the memory cell. In summary, it is determined that the noise current is generated as the data writing pattern including the writing pattern in which the data is written from the H level to the H level or from the L level to the L level.

As an example, the description will be made on a case shown in FIG. 8(d). In the case of FIG. 8(d), the number of written data in the buffer circuit 140 includes no "H" data and eight "L" data. At this point, when all the data held in the memory cell before the writing is performed are "L", then the actual data "rewriting" operation is not performed. However, also in this case, the counter noise current "−4" is output from the counter noise generator 150 to the HVDD power source 130. Therefore, in some cases such as this example, the counter noise current output from the counter noise generator 150 may be the noise against the HVDD power source 130.

Although the accuracy of the current amount of the counter noise current with respect to the generated noise current is decreased to some extent, the current amount of the counter noise current according to the value of ½ of the difference between the number of written data in the H level and the number of written data in the L level held in the buffer circuit 140 is output from the counter noise generator 150 in consideration of the case above. Accordingly, in the DRAM according to the second embodiment, in most cases except an extreme case in which the "rewriting" operation of the data described above is not actually performed, the noise current is reduced by half by the counter noise current output from the counter noise generator 150 so as to make the output voltage of the HVDD power source 130 stable.

As described above, the counter noise generator 150 determines the amount of the counter noise current judging only from the written data held in the buffer circuit 140. Therefore, the accuracy of the amount of the counter noise current supplied from the counter noise generator 150 decreases to some extent. However, as described in FIG. 3 in the first embodiment, it is possible to output the data held in the memory cell to the common data line DBus and eliminate the period of the operation of receiving the data by the counter noise generator 150 (time t3 to t4 in FIG. 3). Further, the operation of receiving the written data output from the buffer circuit 140 by the counter noise generator 150 at the time t4 to t5 in FIG. 3 and its waiting time can be eliminated as well. Accordingly, the operation speed is not decreased in the second embodiment compared with the DRAM in the first embodiment.

Additionally, the circuit configuration such as a cash storing the data of the memory cell received by the counter noise generator 150 before writing operation at the time t3 to t4 and the written data output from the buffer circuit 140 at the time t4 to t5 in FIG. 3 described above needs not be provided in the counter noise generator 150. Accordingly, it is possible to form the circuit of the counter noise generator 150 simpler than in the first embodiment.

Note that the present invention is not limited to the above embodiments but can be changed as appropriate within the scope of the present invention. For example, according to the present invention, it is possible to produce significant effect in the eRAM in which the DRAM and the controller or the like are mixedly mounted such as the system LSI. However, the present invention can be applied to a DRAM chip separately prepared from the controller. Further, although the present invention employs HVDD (VDD/2) as the reference voltage for the cell node of the memory cell, the voltage level is not necessarily the HVDD. For example, in a recent DRAM, the reference voltage may be VDD/2−a, which is a bit lower than VDD/2 for improving hold properties. In this case, the counter noise generator of the present invention is applied to the path of VDD/2-a. Further, the reference voltage may be ground voltage GND (0V), for example.

Furthermore, although the value of ½ of the difference between the number of written data in the H level and the number of written data in the L level is employed as the counter noise current amount in the second embodiment, the value may be other than "½" in consideration of the data to be treated or the DRAM circuit configuration or the like.

Moreover, although each of the gate transistors Tr1, . . . , Trn is formed by the NMOS transistor as shown in FIG. 2, it may be formed by the PMOS transistor as well. In this case, the word select signal applied to the word lines WL1, . . . , WLn turns on the gate transistor of the memory cell in the L level (VKK) and turns off the gate transistor of the memory cell in the H level (VPP).

It is apparent that the present invention is not limited to the above embodiments, but may be modified and changed without departing from the scope and spirit of the invention.

What is claimed is:

1. A semiconductor storage device, comprising:
   a reference voltage source connected to a capacitor of a cell included in a memory;
   a buffer circuit holding data to be written in the cell; and
   a counter noise generator outputting a counter noise current canceling a noise current generated by rewriting the data in the cell to the reference voltage source according to the data held in the buffer circuit.

2. The semiconductor storage device according to claim 1, wherein an output voltage of the reference voltage source is equal to or lower than a half of a power supply voltage.

3. The semiconductor storage device according to claim 1, wherein the semiconductor storage device compares the data held in the buffer circuit with data held in the cell subjected to a writing operation before the writing operation and determines current amount of the counter noise current output from the counter noise generator by the comparing result.

4. The semiconductor storage device according to claim 1, wherein
   the data held in the buffer circuit and data held in the cell subjected to a writing operation before the writing operation are formed by a plurality of data in H level and L level, and
   the semiconductor storage device compares the data held in the buffer circuit with the data held in the cell subjected to the writing operation before the writing operation, and determines current amount of the counter noise current output from the counter noise generator according to the comparing result which is a difference between a number of data rewritten from the H level to the L level and a number of data rewritten from the L level to the H level.

5. The semiconductor storage device according to claim 1, wherein the semiconductor storage device determines current amount of the counter noise current output from the counter noise generator by the data held in the buffer circuit.

6. The semiconductor storage device according to claim 1, wherein
   the data held in the buffer circuit is formed by a plurality of data in H level and L level, and
   the semiconductor storage device determines current amount of the counter noise current output from the counter noise generator according to a value of ½ of a difference between a number of data in the H level and a number of data in the L level.

7. The semiconductor storage device according to claim 1, wherein the counter noise current output from the counter noise generator is output during a period in which writing in the cell is performed.

8. The semiconductor storage device according to claim 1, wherein the counter noise current output from the counter noise generator is output after a period in which writing in the cell is performed.

9. The semiconductor storage device according to claim 1, wherein a gate transistor connected to the capacitor of the cell is an NMOS transistor.

10. The semiconductor storage device according to claim 1, wherein a gate transistor connected to the capacitor of the cell is a PMOS transistor.

11. A method of controlling a semiconductor storage device, comprising:
    reading out data of a buffer circuit holding data to be written in a cell;
    comparing the data which is read out with data held in the cell subjected to a writing operation before the writing operation;
    calculating the comparing result which is a difference between a number of data rewritten from H level to L level and a number of data rewritten from L level to H level; and
    determining current amount output from a counter noise generator generating a counter noise current canceling a noise current generated by rewriting the data in the cell to a reference voltage power source according to the calculating result.

12. A method of controlling a semiconductor storage device, comprising:
    reading out data of a buffer circuit holding data to be written in a cell;
    calculating a value of ½ of a difference between a number of data in H level and a number of data in L level of the data which is read out; and
    determining current amount output from a counter noise generator generating a counter noise current canceling a noise current generated by rewriting the data in the cell to a reference voltage power source according to the calculating result.

13. The method of controlling the semiconductor storage device according to claim 11, wherein the counter noise current output from the counter noise generator is output during a period in which writing in the cell is performed.

14. The method of controlling the semiconductor storage device according to claim 11, wherein the counter noise current output from the counter noise generator is output after a period in which writing in the cell is performed.

* * * * *